US011631607B2

(12) United States Patent
Toyomaki et al.

(10) Patent No.: US 11,631,607 B2
(45) Date of Patent: Apr. 18, 2023

(54) CARRIER AND JIG

(71) Applicant: TOKYO ELECTRON LIMITED, Tokyo (JP)

(72) Inventors: Toshiaki Toyomaki, Miyagi (JP); Seiichi Kaise, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 540 days.

(21) Appl. No.: 16/782,495

(22) Filed: Feb. 5, 2020

(65) Prior Publication Data

US 2020/0251372 A1    Aug. 6, 2020

(30) Foreign Application Priority Data

Feb. 6, 2019 (JP) .............................. JP2019-019287

(51) Int. Cl.
| H01L 21/683 | (2006.01) |
| H01L 21/3065 | (2006.01) |
| H01L 21/02 | (2006.01) |
| H01L 21/687 | (2006.01) |
| H01L 21/673 | (2006.01) |

(52) U.S. Cl.
CPC .... *H01L 21/6835* (2013.01); *H01L 21/02274* (2013.01); *H01L 21/3065* (2013.01); *H01L 21/67353* (2013.01); *H01L 21/68707* (2013.01)

(58) Field of Classification Search
CPC ........... H01L 21/6835; H01L 21/02274; H01L 21/3065; H01L 21/67353; H01L 21/68707; H01L 21/67363; H05H 1/00
See application file for complete search history.

(56) References Cited

U.S. PATENT DOCUMENTS

2017/0117170 A1* 4/2017 Wong ................ H01L 21/67167

FOREIGN PATENT DOCUMENTS

JP    2017-098540 A    6/2017

* cited by examiner

*Primary Examiner* — Elias Ullah
(74) *Attorney, Agent, or Firm* — Weihrouch IP

(57) ABSTRACT

A carrier includes a jig and a case. The jig is configured to hold at least one consumable to be loaded into or unloaded from a container. The case is configured to store the jig and the consumable held by the jig.

19 Claims, 5 Drawing Sheets

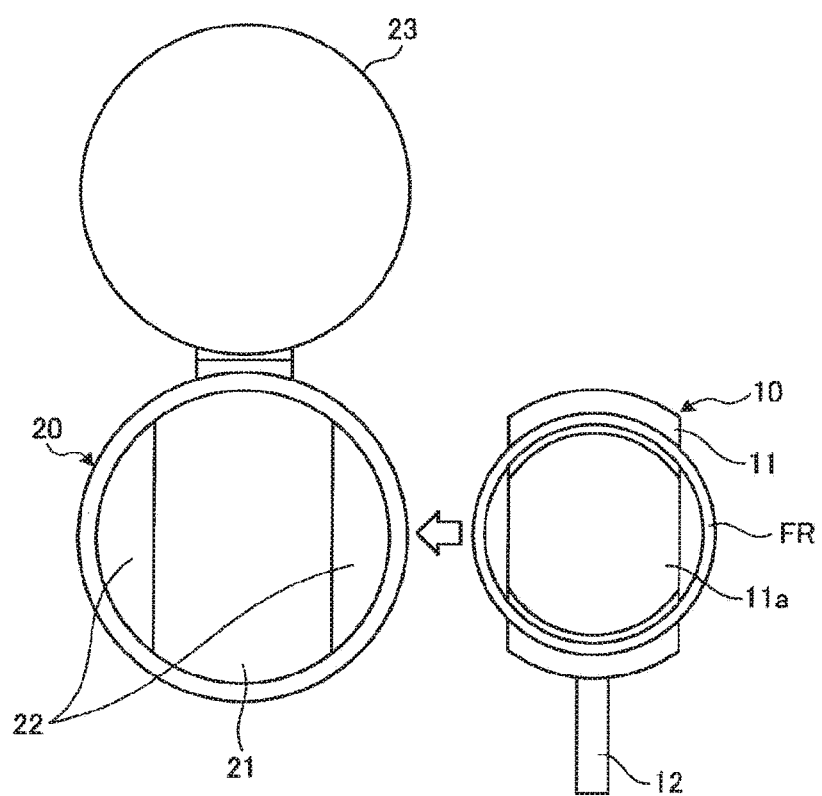

CARRIER AND JIG

CROSS-REFERENCE TO RELATED APPLICATIONS

This application claims priority to Japanese Patent Application No. 2019-019287, filed on Feb. 6, 2019, the entire contents of which are incorporated herein by reference.

TECHNICAL FIELD

The present disclosure relates to a carrier and a jig.

BACKGROUND

Conventionally, a plasma processing apparatus for performing plasma processing on a workpiece such as a semiconductor wafer includes consumables that are gradually degraded by repeated plasma processing. The consumable may be, e.g., a focus ring disposed to surround the outer periphery of the semiconductor wafer. The focus ring is etched by exposure to plasma, and thus should be periodically replaced.

For example, a technique for transferring a focus ring to a container and storing the focus ring in the container in a plasma processing apparatus is suggested (see Japanese Patent Application Publication No. 2017-98540).

The present disclosure provides a technique capable of safely loading and unloading a consumable into and from a container.

SUMMARY

In accordance with an aspect of the present disclosure, there is provided a carrier including: a jig configured to hold at least one consumable to be loaded into or unloaded from a container; and a case configured to store the jig and the consumable held by the jig.

BRIEF DESCRIPTION OF THE DRAWINGS

The objects and features of the present disclosure will become apparent from the following description of embodiments, given in conjunction with the accompanying drawings, in which:

FIGS. 4A to 4C explain an example of a sequence of transferring a focus ring using the carrier.

DETAILED DESCRIPTION

Figure 1:
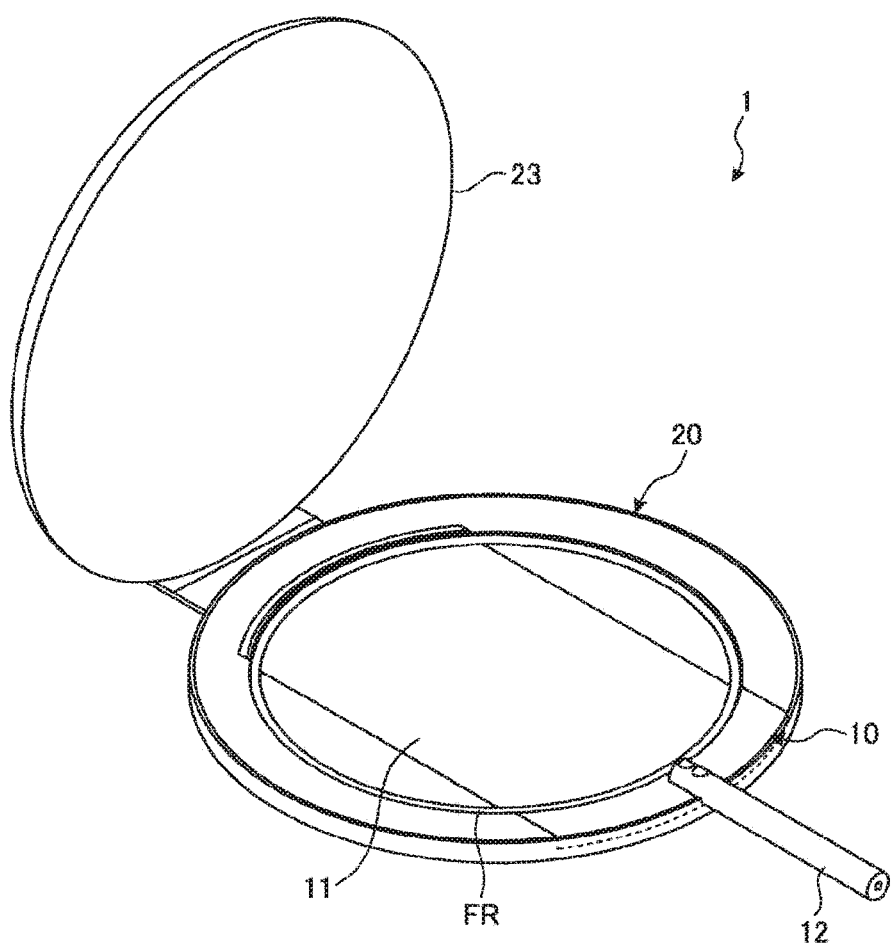
FIG. 1 shows an example of a configuration of a carrier according to an embodiment.

Hereinafter, embodiments will be described in detail with reference to the accompanying drawings. Like reference numerals will be given to like or corresponding parts throughout the drawings.

Conventionally, a plasma processing apparatus for performing plasma processing on a workpiece such as a semiconductor wafer (hereinafter referred to as "wafer") includes consumables that are gradually degraded by repeated plasma processing. A typical example of a consumable is a focus ring disposed to surround the outer periphery of the wafer. The focus ring is etched by exposure to plasma, and thus should be periodically replaced.

For example, Japanese Patent Application Publication No. 2017-98540 suggests a technique for transferring a used focus ring to a container and storing it in the container.

However, the used focus ring stored in the container is unloaded from the container manually by an operator and transferred to a predetermined transfer destination. Further, an unused focus ring is loaded into the container manually by the operator. In other words, the focus ring is manually loaded into and unloaded from the container by the operator.

In the case of manually loading and unloading the focus ring into and from the container, it is difficult to transfer the focus ring safely. For example, when an inexperienced operator manually loads or unloads the focus ring into or from the container, the focus ring may be damaged by collision or through contact with the wall of the container. Further, since the used focus ring has a sharp edge, an operator may be injured when touching the focus ring. In addition, when the used focus ring unloaded from the container is transferred to a predetermined transfer destination, the operator may drop the focus ring and cause damage to the focus ring.

<Configuration of the Carrier>

A carrier according to an embodiment transfers a consumable that is loaded into or unloaded from a container.

Here, the consumable is a component that is disposed inside a chamber of a plasma processing apparatus for performing plasma processing on a workpiece, e.g., a wafer or the like, and is deteriorated by repeated plasma treatment. Thus, the deteriorated consumable should be replaced. The consumable is, for example, an annular component such as a focus ring, a cover ring, or the like that is disposed to surround the outer periphery of the wafer. The consumable may include any other component that can be transferred by a transfer mechanism such as a robot arm between the chamber of the plasma processing apparatus and the container capable of storing the consumable. In the following description, the embodiment will be described by using the focus ring as an example of the consumable. The container is configured to store, for example, the focus ring, and is also referred to as "front opening unified pod (FOUP)." A shelf-shaped holder for holding the focus ring is disposed in the container. The container has a plurality of shelf-shaped holders depending on the number of focus rings to be stored. Since the structure of the container is described in, e.g., Japanese Patent Application Publication No. 2017-98540, detailed description thereof is omitted.

FIG. 1 shows an example of a configuration of a carrier 1 according to the embodiment. The carrier 1 shown in FIG. 1 includes a jig 10 and a case 20. The jig 10 holds a focus ring FR to be loaded into or unloaded from a container (not shown) capable of storing the focus ring FR. The case 20 stores the focus ring FR held by the jig 10 together with the jig 10.

An operator transfers the focus ring FR using the carrier 1 when loading or unloading the focus ring FR into or from the container. In other words, when the operator unloads a used focus ring FR stored in the container from the container, the operator uses the jig 10 to hold the used focus ring FR. Next, the operator transfers the used focus ring FR held by the jig 10 into the case 20, and then transfers the used focus ring FR stored in the case 20 together with the jig 10 to a predetermined transfer destination. When the operator loads an unused focus ring FR into the container, the operator transfers the unused focus ring FR stored in the case 20 together with the jig 10 to the container. Then, the operator loads the unused focus ring FR held by the jig 10 into the container.

When the operator loads or unloads the focus ring FR into or from the container, the focus ring FR is held by the jig 10 and stored in the case 20 together with the jig 10 and, thus, the focus ring FR can be safely transferred. For example, even if the operator is inexperienced, the loading and unloading of the focus ring FR into and from the container is carried out by using the jig 10. Therefore, the risk that the focus ring FR is damaged by collision (or through contact) with the wall of the container can be reduced. In addition, since the operator does not directly touch the used focus ring FR having a sharp edge, the risk that the operator is injured can be reduced. Further, since the focus ring FR that is being transferred is protected by the case 20, the risk that the focus ring FR is dropped and damaged can be reduced.

<Configuration of the Jig and Case>

Figure 2:
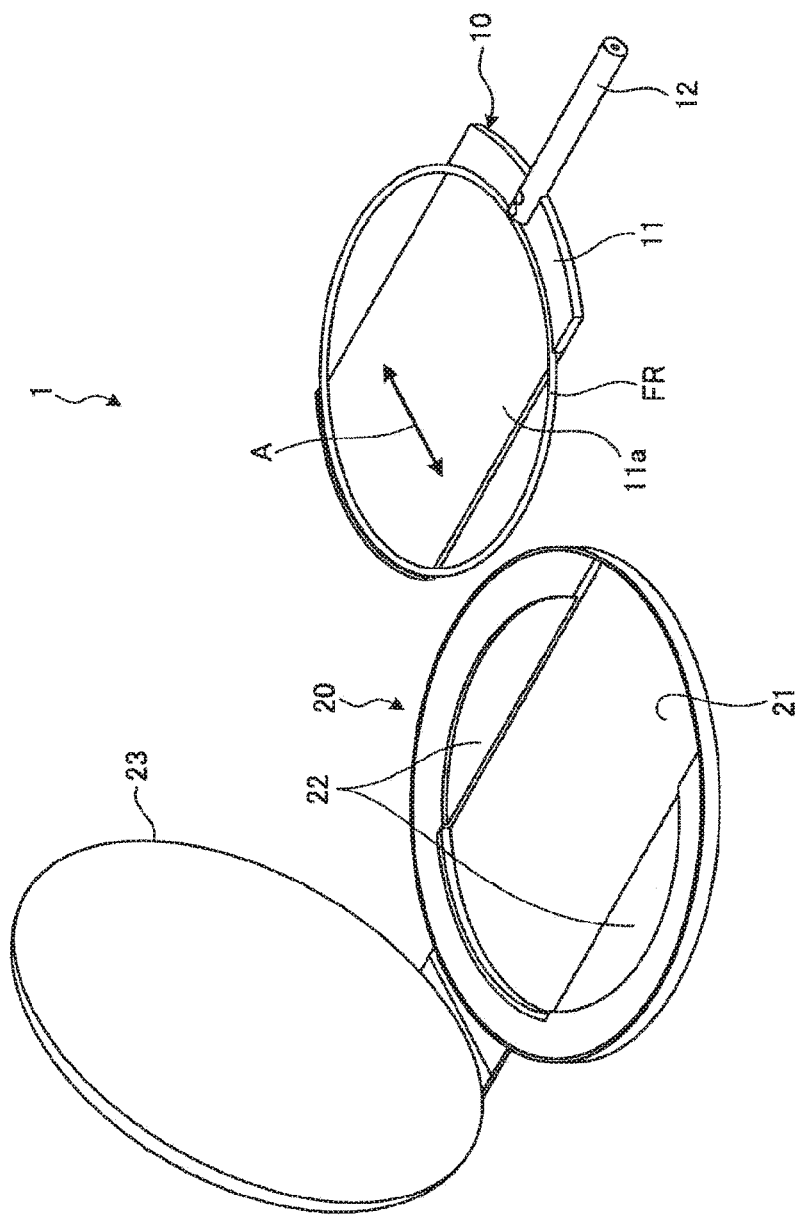
FIG. 2 shows an example of a state in which a jig and a case in the carrier are separated.

FIG. 2 shows an example of a state in which the jig 10 and the case 20 in the carrier 1 are separated. The jig 10 includes a main body 11 configured to hold the focus ring FR and a grip portion 12 that is disposed at the main body 11 and gripped by an operator who loads and unloads the focus ring FR.

The main body 11 has a shape that does not interfere with the shelf-shaped holder disposed in the container to hold the focus ring FR. For example, it is assumed that a pair of shelf-shaped holders that face each other are disposed in the container in a direction (direction of arrow A in FIG. 2) perpendicular to a direction in which the focus ring FR is loaded into or unloaded from the container. In this case, the main body 11 has a flat plate shape whose width in the direction of the arrow A is smaller than a gap between the pair of shelf-shaped holders facing each other.

The main body 11 may be made of any material that is softer than a material of the focus ring FR. For example, the main body 11 may be made of a non-metallic material such as resin. For instance, when the focus ring FR is made of silicon, the main body 11 is made of a non-metallic material that is softer than silicon.

Figure 3:
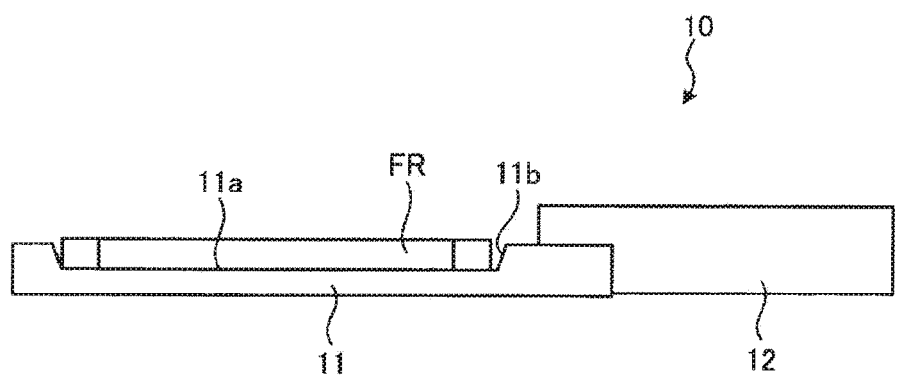
FIG. 3 shows an example of a side cross-section of a jig.

The main body 11 has a recess 11a at a position where the focus ring FR is disposed. The recess 11a restricts the movement of the focus ring FR in a direction parallel to the plane of the main body 11. FIG. 3 shows an example of a side cross-section of the jig 10. As shown in FIG. 3, the recess 11a has on a sidewall thereof a sloped surface 11b that is sloped such that a width of the recess 11a increases toward an opening of the recess 11a (that is, the sloped surface 11b is outwardly sloped from the bottom portion to the upper portion of the recess 11a). The sloped surface 11b serves to guide the focus ring FR toward the bottom portion of the recess 11a.

Referring back to FIG. 2, the grip portion 12 has a substantially cylindrical shape to be easily gripped by an operator. The grip portion 12 can be detachably attached to the main body 11. Therefore, the grip portion 12 can be detached from the main body 11 in a state where the jig 10 is stored in the case 20.

The case 20 is configured to store the focus ring FR held by the jig 10 together with the jig 10. Specifically, the case 20 has a jig recess 21, a holding portion 22, and a lid 23. The jig 10 is engaged with the jig recess 21. The holding portion 22 holds the focus ring FR in a state where the jig 10 is engaged with the jig recess 21. The focus ring FR is sandwiched between the lid 23 and the holding portion 22. Accordingly, the focus ring FR held by the jig 10 is stored in the case 20 together with the jig 10.

When the focus ring FR is sandwiched between the holding portion 22 and the lid 23, the surface of the focus ring FR may be damaged by the contact between the holding portion 22 and the focus ring FR or between the lid 23 and the focus ring FR. Therefore, it is preferred that the case 20 has a buffering member on at least one of the holding portion 22 or the lid 23. Accordingly, the damage inflicted to the focus ring FR by the contact between the holding portion 22 and the focus ring FR or between the lid 23 and the focus ring FR can be prevented.

The case 20 is at least partially transparent. For example, the case 20 is made of a transparent resin and entirely transparent. Therefore, an operator can visually check the presence of the focus ring FR and the jig 10 in the case 20.

<Focus Ring Transfer Sequence>

Figure 4B:
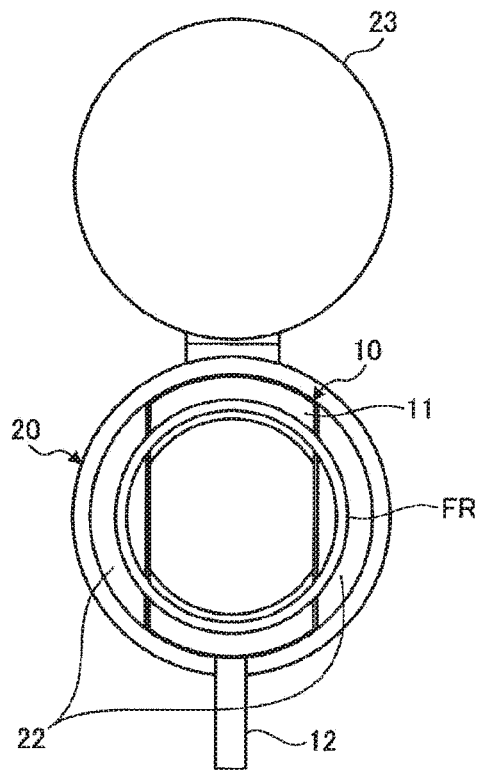
Figure 4C:
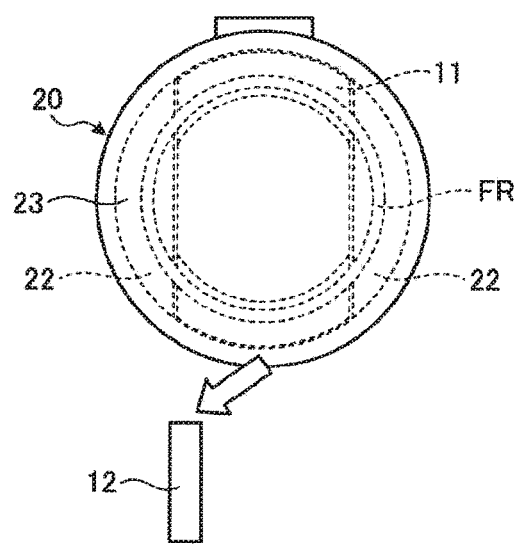

Next, a sequence of transferring the focus ring FR using the carrier 1 will be described. FIGS. 4A to 4C show an example of the transferring sequence of the focus ring FR using the carrier 1. Specifically, FIGS. 4A to 4C show an example of the sequence when a used focus ring stored in a container is unloaded and transferred.

First, the focus ring FR is held by the jig 10. Specifically, the main body 11 of the jig 10 is loaded into the container while the operator grips the grip portion 12. When the focus ring FR held by the pair of shelf-shaped holders in the container is disposed in the recess 11a of the main body 11, the focus ring FR is held by the jig 10. Then, the focus ring FR held by the jig 10 is loaded into the case 20 as indicated by, e.g., an arrow in FIG. 4A.

Next, the focus ring FR held by the jig 10 is stored in the case 20 together with the jig 10. Specifically, the focus ring FR is held by the holding portion 22 in a state where the jig 10 (the main body 11) is engaged with the jig recess 21, so that the focus ring FR is stored in the case 20 together with the jig 10 as shown in FIG. 4B, for example. The grip portion 12 of the jig 10 protrudes outside the case 20 in a state where the focus ring FR is stored in the case 20 together with the jig 10.

Then, the focus ring FR is transferred to a predetermined transfer destination in a state where the focus ring FR is stored in the case 20 together with the jig 10. Specifically, the grip portion 12 of the jig 10 is detached from the main body 11 as indicated by an arrow in FIG. 4C, for example. Then, the lid 23 is closed and the focus ring FR is sandwiched between the lid 23 and the holding portion 22. Accordingly, the entire focus ring FR is covered by the case 20. Then, the focus ring FR covered by the case 20 is transferred to the predetermined transfer destination.

As described above, the carrier 1 according to the embodiment includes the jig 10 configured to hold the focus ring FR to be loaded into or unloaded from the container configured to store the focus ring FR, and the case 20 that stores the focus ring FR held by the jig 10 together with the jig 10. Accordingly, the focus ring FR can be transferred safely. For example, even if the operator is inexperienced, the loading and unloading of the focus ring FR into and from the container is carried out by using the jig 10. Therefore, the risk that the focus ring FR is damaged by collision or through contact with the wall of the container can be reduced. Further, since the operator does not directly touch the used focus ring FR having a sharp edge, the risk that the operator is injured can be reduced. Furthermore, since the focus ring FR that is being transferred is protected by the case 20, the risk that the focus ring FR is dropped and damaged can be reduced.

In the carrier 1 according to the embodiment, the jig 10 has the main body 11, configured to hold the focus ring FR, and the grip portion 12, disposed at the main body 11 and gripped by the operator who loads and unloads the focus ring FR. Therefore, the operator can grip the grip portion 12 to load and unload the focus ring FR, and load the focus ring FR into the case 20 without directly touching the focus ring FR.

Further, in the carrier 1 according to the embodiment, the main body 11 has a shape that does not interfere with the shelf-shaped holder that is disposed in the container to hold the focus ring FR. Therefore, when the focus ring FR is loaded into or unloaded from the container, it is possible to prevent collision or contact between the main body 11 and the shelf-shaped holder in the container.

Moreover, in the carrier 1 according to the embodiment, the main body 11 has the recess 11a at a position where the focus ring FR is disposed. Therefore, the movement of the focus ring FR held by the main body 11 can be restricted by the sidewall of the recess 11a, and it is possible to prevent the focus ring FR from falling from the main body 11.

Further, in the carrier 1 according to the embodiment, the recess 11a has on the sidewall thereof the sloped surface 11b that is sloped such that the width of the recess 11a increases toward the opening of the recess 11a. Accordingly, the focus ring FR is guided toward the bottom portion of the recess 11a and the movement of the focus ring FR by the sidewall of the recess 11a can be further restricted.

Further, in the carrier 1 according to the embodiment, the grip portion 12 is detachably attached to the main body 11. Therefore, the grip portion 12 can be detached from the main body 11 in a state where the jig 10 is stored in the case 20.

Further, in the carrier 1 according to the embodiment, the case 20 includes the jig recess 21 with which the jig 10 is engaged, and the holding portion 22 for holding the focus ring FR in a state where the jig 10 is engaged with the jig recess 21. The case 20 further includes the lid 23 configured to cover the focus ring FR to sandwich the focus ring FR between the lid 23 and the holding portion 22. Since the focus ring FR is fixed in the case 20, it is possible to prevent the collision or the contact between the focus ring FR and the inner wall of the case 20.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above embodiment, the case 20 stores one focus ring FR. However, the case 20 may store a plurality of focus rings FR.

Further, in the above embodiment, the main body 11 of the jig 10 has a flat plate shape. However, the shape of the main body 11 is not limited thereto. For example, the main body 11 may have a fork shape that allows the focus ring FR to be supported at three or more positions. For example, the main body 11 may have any shape as long as it does not interfere with the shelf-shaped holder that is disposed in the container to hold the focus ring FR.

Further, in the above embodiment, the grip portion 12 of the jig 10 is detachably attached to the main body 11. However, the grip portion 12 may not be detachable from the main body 11.

Further, in the above embodiment, the case 20 is entirely transparent. However, the present disclosure is not limited thereto. The case 20 may be partially transparent.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A carrier comprising:
a jig configured to hold at least one consumable to be loaded into or unloaded from a container; and
a case configured to store the jig and the consumable held by the jig,
wherein the case includes a closure member which is movable between an open position, in which the case is in an open state, and a closed position, in which the case is in a closed state, and
wherein the case is configured to receive the jig holding the consumable in the open state, and in the closed state the case is configured to contain and hold at least a portion of the jig and the consumable held by the jig within the case.

2. The carrier of claim 1, wherein the jig includes:
a main body configured to hold the consumable; and
a grip portion that is detachably attached to the main body and configured to be gripped by an operator who loads and unloads the consumable,
wherein in the closed state, the case holds the main body of the jig holding the consumable, with the grip portion detached from the main body.

3. The carrier of claim 2, wherein the main body of the jig includes a recess configured to hold the consumable.

4. The carrier of claim 3, wherein the recess of the jig has on a sidewall thereof a sloped surface that is sloped such that a width of the recess increases toward an opening of the recess.

5. The carrier of claim 1, wherein the case includes:
a jig recess with which the jig is engaged;
a holding portion configured to hold the consumable in a state where the jig is engaged with the jig recess and the consumable is on top of the jig; and
the closure member includes a lid configured to cover the consumable and to sandwich the consumable between the lid and the holding portion.

6. The carrier of claim 5, wherein the case further includes a buffering member on at least one of the holding portion or the lid of the case.

7. The carrier of claim 1, wherein the case is at least partially transparent.

8. The carrier of claim 1, wherein the consumable is disposed in a chamber of a plasma processing apparatus.

9. The carrier of claim 8, wherein the consumable is an annular component.

10. The carrier of claim 1, wherein the jig includes a main body which holds the consumable, and
the case includes a jig recess which holds the main body of the jig.

11. The carrier of claim 10, wherein the jig includes a consumable recess configured to hold the consumable.

12. The carrier of claim 11, wherein the closure member includes a lid.

13. The carrier of claim 1, wherein the jig includes a main body, the main body including a consumable recess configured to hold the consumable; and
the case includes a main body recess configured to hold the main body of the jig.

14. The carrier of claim 13, wherein the jig includes a grip portion which is detachably connected to the main body of the jig, and wherein in the closed state of the case, the case holds the main body of the jig in the main body recess, with the consumable on top of the main body, and with the grip portion detached from the main body so that the grip portion is outside of the case.

15. The carrier of claim 14, wherein the case is a transportable case configured to transport the jig main body and the consumable, with the jig main body and the consumable therein, the case further including a first holding portion on one side of the main body recess and a second holding portion on an opposite side of the main body recess; and wherein with the main body of the jig positioned in the main body recess of the case and the consumable above the jig, a first portion of the consumable is above the first holding portion of the case, a second portion of the consumable is above the second holding portion of the case, and a third portion of the consumable is above the main body of the jig.

16. A jig for holding a consumable to be loaded into or unloaded from a container, the jig comprising:

a main body which includes a consumable recess configured to hold the consumable; and a grip portion removably coupled to the main body, the grip portion configured to be gripped by an operator who loads and unloads the consumable.

17. The jig of claim 16, in combination with a case, the case having an open state to receive the jig holding the consumable, the case further including a closed state configured to contain and hold the main body of the jig holding a consumable with the grip portion detached from the main body.

18. The jig and case of claim 17, wherein the case includes a jig main body recess which receives and holds the jig main body.

19. The carrier of claim 18, wherein the case is a transportable case configured to transport the jig main body and the consumable, with the jig main body and the consumable therein, the case further including a first holding portion on one side of the main body recess and a second holding portion on an opposite side of the main body recess; and wherein with the main body of the jig positioned in the jig main body recess of the case and the consumable held by the jig, a first portion of the consumable is above the first holding portion of the case, a second portion of the consumable is above the second holding portion of the case, and a third portion of the consumable is in the recess of the main body of the jig.

* * * * *